(12) United States Patent
Konstantinov

(10) Patent No.: US 9,741,873 B2
(45) Date of Patent: Aug. 22, 2017

(54) AVALANCHE-RUGGED SILICON CARBIDE (SIC) POWER SCHOTTKY RECTIFIER

(71) Applicant: FAIRCHILD SEMICONDUCTOR CORPORATION, San Jose, CA (US)

(72) Inventor: Andrei Konstantinov, Sollentuna (SE)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 15/079,586

(22) Filed: Mar. 24, 2016

(65) Prior Publication Data

US 2016/0284871 A1 Sep. 29, 2016

Related U.S. Application Data

(60) Provisional application No. 62/139,368, filed on Mar. 27, 2015.

(51) Int. Cl.
*H01L 29/872* (2006.01)
*H01L 29/66* (2006.01)
*H01L 29/16* (2006.01)
*H01L 29/06* (2006.01)

(52) U.S. Cl.
CPC ........ *H01L 29/872* (2013.01); *H01L 29/0615* (2013.01); *H01L 29/0619* (2013.01); *H01L 29/1608* (2013.01); *H01L 29/6606* (2013.01); *H01L 29/0692* (2013.01)

(58) Field of Classification Search
CPC ............. H01L 29/0619; H01L 29/0684; H01L 29/0692; H01L 29/6606; H01L 29/872
See application file for complete search history.

(56) References Cited

U.S. PATENT DOCUMENTS

| 7,728,402 | B2 | 6/2010 | Zhang et al. |
| 7,851,881 | B1 * | 12/2010 | Zhao ............... H01L 21/0495 |
| | | | 257/155 |
| 7,863,682 | B2 | 1/2011 | Okuno et al. |
| 8,633,560 | B2 | 1/2014 | Aketa |
| 8,664,665 | B2 | 3/2014 | Henning et al. |
| 8,680,587 | B2 | 3/2014 | Henning et al. |

(Continued)

OTHER PUBLICATIONS

Rupp et al,, "Avalanche Behaviour and its Temperature Dependence of Commercial SiC MPS Diodes: Influence of Design and Voltage Class", Proceedings of the 26th International Symposium on Power Semiconductor Devices & IC's, Jun. 15-19, 2014, pp. 67-70.

(Continued)

*Primary Examiner* — Allan R Wilson
(74) *Attorney, Agent, or Firm* — Brake Hughes Bellermann LLP

(57) ABSTRACT

In at least one general aspect, a SiC device can include a drift region of a first conductivity type, a shielding body, and a Schottky region. The SiC device can include a rim having a second conductivity type at least partially surrounding the shielding body and the Schottky region. The SiC device can include a termination region at least partially surrounding the rim and having a doping of the second conductivity type. The termination region can have a transition zone disposed between a first zone and a second zone where the first zone has a top surface lower in depth than a depth of a top surface of the second zone and the transition zone has a recess.

19 Claims, 12 Drawing Sheets

(56) References Cited

U.S. PATENT DOCUMENTS

| | | | |
|---|---|---|---|
| 8,952,481 B2* | 2/2015 | Zhang | H01L 29/6606 257/471 |
| 2001/0008447 A1 | 7/2001 | Nikoonahad et al. | |
| 2013/0062723 A1* | 3/2013 | Henning | H01L 29/8611 257/484 |
| 2014/0001490 A1* | 1/2014 | Konstantinov | H01L 29/872 257/77 |
| 2014/0138705 A1* | 5/2014 | Zhang | H01L 29/6606 257/77 |
| 2015/0206941 A1* | 7/2015 | Uehigashi | H01L 29/872 257/77 |

OTHER PUBLICATIONS

Temple, Victor, "Increased Avalanche Breakdown Voltage and Controlled Surface Electric Fields Using a Junction Termination Extension (JTE) Technique", IEEE Transactions on Electron Devices, vol. ED-30, No. 8, Aug. 1983, pp. 954-957.

K. Mochizuki et al, "Observation and analysis of a non-uniform avalanche phenomenon in 4H-SiC 4°-off (0001) p-n diodes terminated with a floating-field ring", Abstracts of ICSCRM-2014, 2014, 2 pages.

X. Huang, G. Wang, L. Jiang and A.Q. Huang, "Ruggedness analysis of 600V 4H-SiC JBS diodes under repetitive avalanche conditions" in Applied Power Electronics Conference and Exposition (APEC), 2012 Twenty-Seventh Annual IEEE, pp. 1688-1691, Feb. 2012.

"Combined Single-Pulse and Repetitive UIS Rating System", AN-7515, Fairchild Semiconductor Corporation, 2002, 7 pages.

* cited by examiner

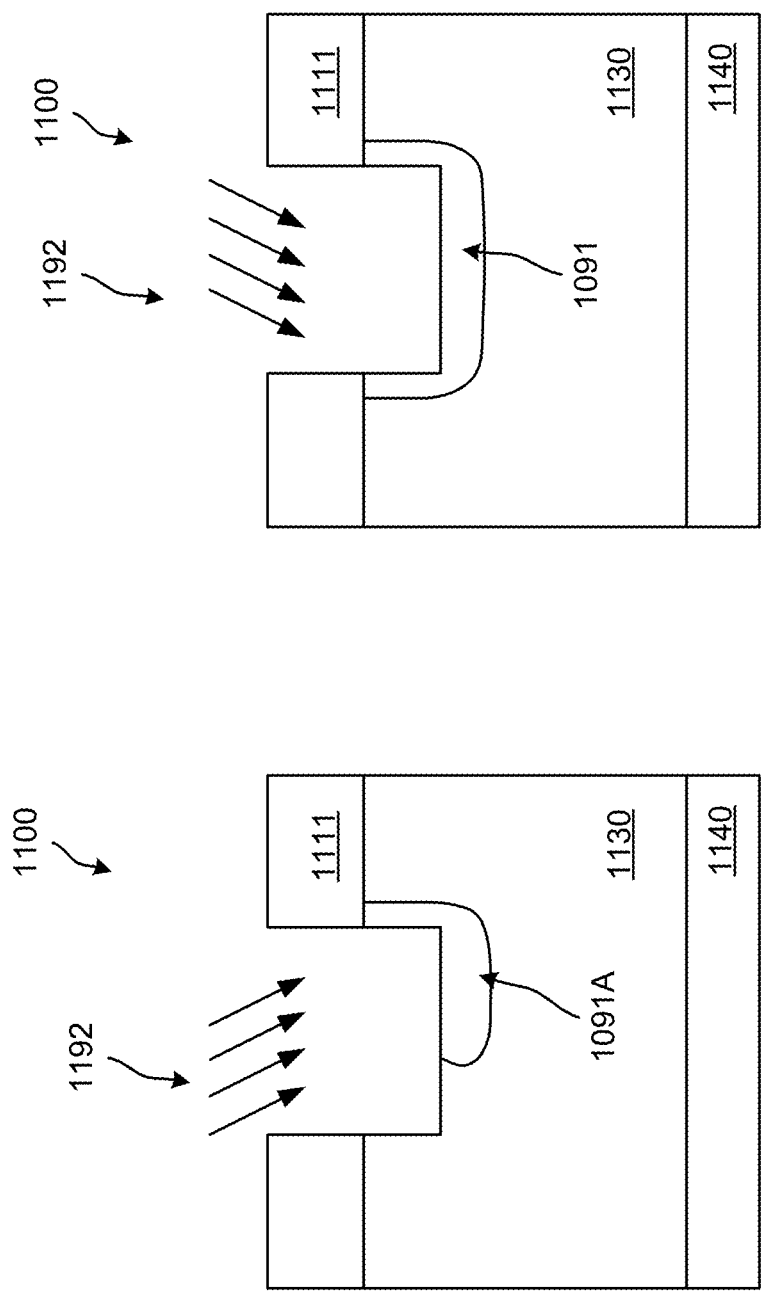

AVALANCHE-RUGGED SILICON CARBIDE (SIC) POWER SCHOTTKY RECTIFIER

RELATED APPLICATION

This application claims priority to and benefit of U.S. Provisional Application 62/139,368, filed Mar. 27, 2015, "Avalanche-Rugged Silicon Carbide (SiC) Power Schottky Rectifier", which is incorporated herein by reference herein in its entirety.

TECHNICAL FIELD

This description relates to a silicon carbide (SiC) Schottky-barrier power rectifier.

BACKGROUND

In a high voltage silicon carbide (SiC) Schottky-barrier power rectifier, excessive currents can occur in a termination region under avalanche conditions. Known solutions are not sufficient to address these, and other issues, that are prevalent in SiC Schottky-barrier power rectifiers.

SUMMARY

In at least one general aspect, a SiC device can include a drift region of a first conductivity type, a shielding body, and a Schottky region. The SiC device can include a rim having a second conductivity type at least partially surrounding the shielding body and the Schottky region. The SiC device can include a termination region at least partially surrounding the rim and having a doping of the second conductivity type. The termination region can have a transition zone disposed between a first zone and a second zone where the first zone has a top surface lower in depth than a depth of a top surface of the second zone and the transition zone has a recess.

In another general aspect, a silicon carbide (SiC) device can include a drift region of a first conductivity type and an array of a plurality of shielding bodies interleaved with a plurality of Schottky regions. The SiC device can include a rim having a second conductivity type at least partially surrounding the array and a termination region at least partially surrounding the rim. The termination region can have a first zone having a doped region with a first thickness and the termination region can have a second zone having a doped region with a second thickness.

In yet another general aspect, a method can include producing a silicon carbide (SiC) device can include comprising forming a drift region of a first conductivity type, forming a shielding body, and forming a Schottky region. The method can include forming a rim having a second conductivity type at least partially surrounding the shielding body and the Schottky region and forming a termination region at least partially surrounding the rim and having a doping of the second conductivity type. The termination region can have a transition zone disposed between a first zone and a second zone, and the first zone can have a top surface lower in depth than a depth of a top surface of the second zone. The transition zone can have a recess.

BRIEF DESCRIPTION OF THE DRAWINGS

FIGS. 11A and 11B are diagrams that illustrate a process of producing a unit cell of a shielding body with the vertical sidewalls doped by an inclined implant.

DETAILED DESCRIPTION

In some implementations, a high voltage silicon carbide (SiC) Schottky-barrier power rectifier can have a drift region of a first conductivity type, an array (e.g., a linear array) of one or more shielding bodies (e.g., p-bodies) of the second conductivity type and surrounded by a rim (e.g., an anode rim) of the second conductivity type, and a termination region (e.g., junction termination region) of the second conductivity type surrounding the rim. One or more shielding bodies may be formed in, or may be defined by, a trench. A doped region (e.g., an implantation (or junction)) depth within the trench, which can define at least a portion of a contact area, can be at least one third of the trench depth. The doped region within the one or more shielding bodies (which can be referred to as shielding body doped regions) can be of the second conductivity type. The termination region can have multiple zones including a first zone (e.g., an inner zone), a second zone (e.g., an outer zone), and a transition zone disposed between the first zone and the second zone. The termination region can have a doped region of the second conductivity type and can have an outer periphery (e.g., second zone) partially removed (e.g., etched, polished, bombarded) away, so as to partially remove the acceptor charge. In some implementations, the transition zone (which can be referred to as a charge transition zone) can be included in proximity to the step (e.g., etched step). A region (e.g., a first zone) on a first side of the transition zone can be a relatively high charge zone, and a region (e.g., a second zone) on a second side of the transition zone can have a relatively low charge. In some implementations, a metal contact can be formed so as to at least partially or fully overlap one or more of the array of shielding bodies, and/or to form a Schottky barrier to the SiC of the first conductivity type adjacent to the one or more shielding bodies and tunnel contact to the one or more shielding bodies. In some implementations, the rectifier can have avalanche robustness. Although some of the examples described herein specify a particular conductivity type (e.g., p-type conductivity, n-type conductivity), the conductivity types can be reversed in some implementations.

Figure 1:
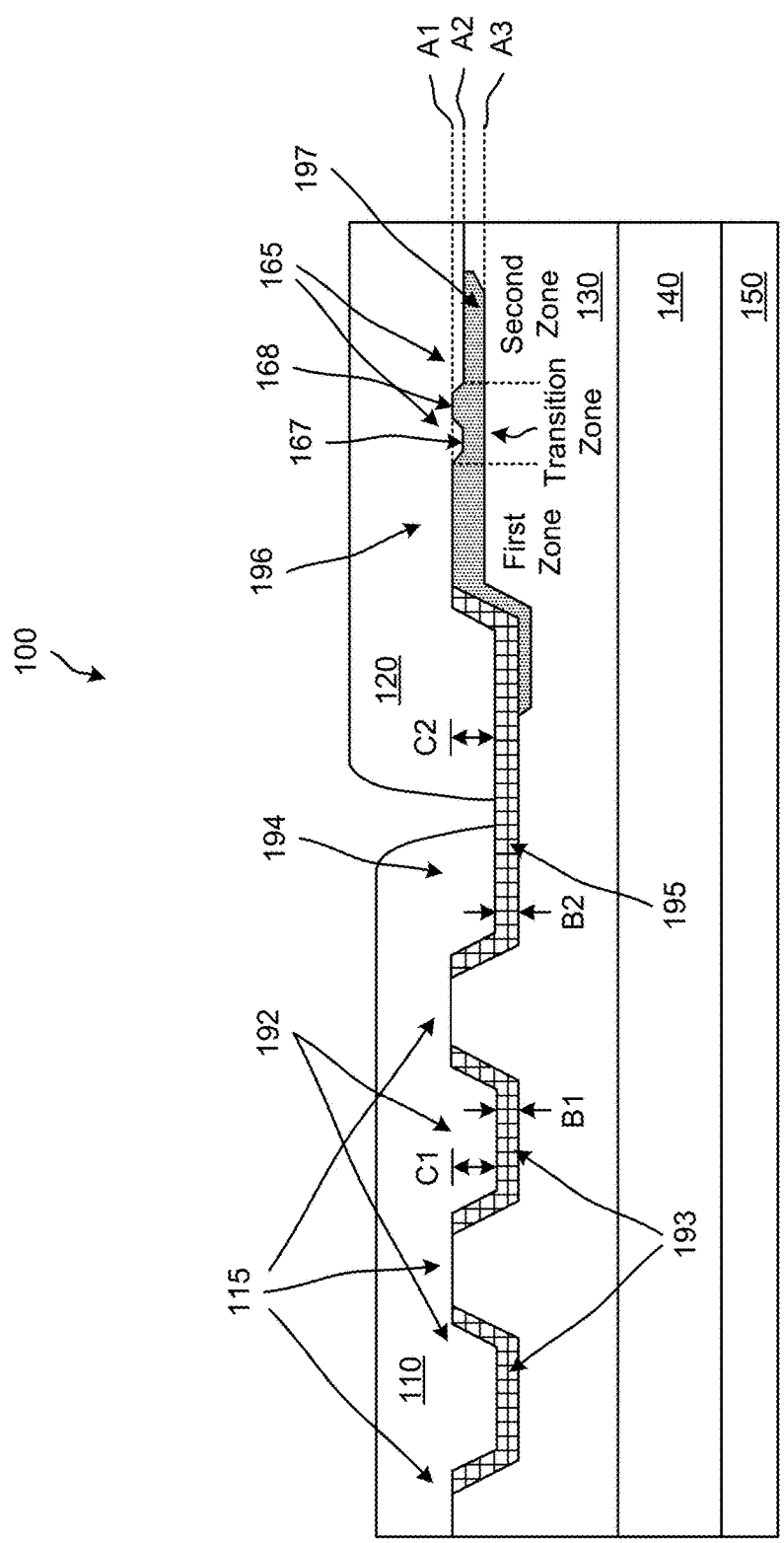
FIG. 1 is a diagram that illustrates a side cross-sectional view of a high voltage silicon carbide (SiC) device.

A specific example of a high voltage silicon carbide (SiC) device 100 is illustrated in the side cross-sectional view shown in FIG. 1. The SiC device 100 can be a high voltage device. The SiC device 100 can be a referred to as a high voltage SiC Schottky-barrier power rectifier.

In FIG. 1, the SiC device 100 can have a drift region 130 (e.g., a n-type drift region), shielding bodies 192 (e.g., a linear array of p-type shielding bodies), a rim 194 (e.g., surrounded by a p-type rim), and a termination region 196 (e.g., a p-type termination region at least partially or completely surrounding the rim 194). The shielding bodies 192 may be formed in a trench. Each of the shielding bodies 192 includes a shielding body doped region 193. The rim 194 can have a rim doped region 195. Also as shown in FIG. 1, the SiC device 100 has a substrate 140 (e.g., a SiC substrate) and a backside metal 150.

The termination region 196 (e.g., junction termination region) is defined at least in a part by a doped region 197. The termination region 196 has a several zones—a first zone, a transition zone, and a second zone. The transition zone is disposed between the first zone and the second zone. The second zone can define an outer periphery of the termination region 196. As shown in FIG. 1, the termination region 196

As shown in FIG. 1, the second zone of the termination region 196 can have an outer periphery at least partially removed (e.g., etched) away, so as to partially remove at least a portion of the acceptor charge in the second zone. Accordingly, a top surface (e.g., an entirety of a top surface) of the second zone (which is illustrated by plane A2) is lower than a top surface (e.g., an entirety of a top surface) of the first zone. The transition zone includes at least a mesa 168 and a recess 167.

In this implementation, the mesa 168 has a top surface at a same height (or vertical level or depth) as the top surface of the first zone (at plane A1). In some implementations, the top surface of the mesa 168 can be at a different height (or vertical level or depth) (e.g., lower height, greater height) than the top surface of the first zone.

In this implementation, the recess 167 has a top surface at a same depth (or vertical level or depth) as the top surface of the second zone (at plane A2). In some implementations, the top surface of the recess 167 can be at a different height (or vertical level or depth) (e.g., lower depth, higher depth) than the top surface of the second zone.

The transition zone (e.g., charge transition zone) can have a boundary (e.g., left boundary) defined by (or can be in proximity) to a step (e.g., an etched step) (of the recess 167). The transition zone (e.g., charge transition zone) can have a boundary (e.g., right boundary) defined by (or can be in proximity) to an edge of the mesa 168. The first zone can be a relatively high charge zone and the second zone can be a relatively low charge zone.

The zones (e.g., first zone, transition zone, second zone) can have different depths or recessed (e.g., removed, etched) regions 165 (which can be etched rings) so that the zones have different net charges. The first zone can have a net charge greater than a net charge of the transition zone. The transition zone can have a net charge greater than a net charge of the second zone. Specifically, the thicknesses of portions of the doped region 197 associated with the zones can be different to result in differences in net charge associated with the zones. More recessed (e.g., removed, etched) regions (and/or etched region depths or levels) than shown in FIG. 1 can be included in a termination region 196.

The doped region 197 of the first zone, the transition zone, and the second zone of the termination region 196 can each have a same depth at plane A3. Doped regions associated with each of the zones can be referred to as portions of the doped region 197 or can be referred to individually as doped regions (or areas) of the zones. Even though the depth of a portion of the doped region 197 associated with the first zone is the same as the depth of the a portion of the doped region 197 of the transition region and the second zone, the thicknesses (or average thicknesses) of the portions of the doped region 197 associated with the zones is different (based on the removed (e.g., etched) portions). These differences result in the differences in net charge as noted above.

In this implementation, an average thickness of a portion of the doped region 197 of the first zone is greater than an average thickness of a portion of the doped region 197 of the transition zone. In this implementation, an average thickness of the portion of the doped region197 of the transition zone is greater than an average thickness of a portion of the doped region 197 of the second zone.

The implantation (or junction) depth of the shielding body doped regions 193 can define at least a portion of a contact area and can be at least one third of the trench depth (from a top of a mesa between the shielding bodies 192 and a bottom of a trench of the shielding bodies 192). In some implementations, the shielding body doped regions 193 of one or more of the shielding bodies 192 can have a thickness (e.g., thickness B1) the same as a thickness (e.g., thickness B2) of the rim doped region 195 of the rim 194. In some implementations, the shielding body doped regions 193 of one or more of the shielding bodies 192 can have a thickness (e.g., thickness B1) different than (e.g., greater than, less than) a thickness (e.g., thickness B2) of the rim doped region 195 of the rim 194.

In some implementations, a doping concentration of the shielding body doped regions 193 of the shielding bodies 192 can be the same as a doping concentration of the rim doped region 195 of the rim 194. In some implementations, a doping concentration of the shielding body doped regions 193 of the shielding bodies 192 can be different from a doping concentration of the rim doped region 195 of the rim 194.

In some implementations, one or more of the shielding bodies 192 can have a trench (e.g., trench C1) with a depth the same as a depth of a trench (e.g., trench C2) of the rim 194. In some implementations, one or more of the shielding bodies 192 can have a trench with a depth different from (e.g., higher than, lower than) a depth of the trench of the rim 194.

In some implementations, one or more of the shielding bodies 192 can have a trench with a width less than a width of a trench of the rim 194. In some implementations, one or more of the shielding bodies 192 can have a trench with a width equal to or greater than a width of the trench of the rim 194.

In some implementations, one or more the shielding body doped regions 193 can have a doping concentration the same as the doping concentration of the rim doped region 195. In some implementations, one or more of the shielding body doped regions 193 can have a doping concentration different than (e.g., greater than, less than) the doping concentration of the rim doped region 195.

A metal 110 (e.g., a metal contact or layer) can be formed so as to overlap the shielding bodies 192 (e.g., array of p-bodies), and to form Schottky regions 115 (e.g., Schottky barriers) to the SiC adjacent to the shielding bodies 192 and tunnel contact to the shielding bodies 192. In this example implementation, the SiC device 100 (e.g., SiC rectifier) can have robustness against avalanche. The metal 110 can be disposed over (e.g., formed over) at least a portion of the rim 194. Also, as shown in FIG. 1, a dielectric 120 can be disposed (e.g., formed) over at least a portion of the rim 194 and the termination region 196.

Figure 2:
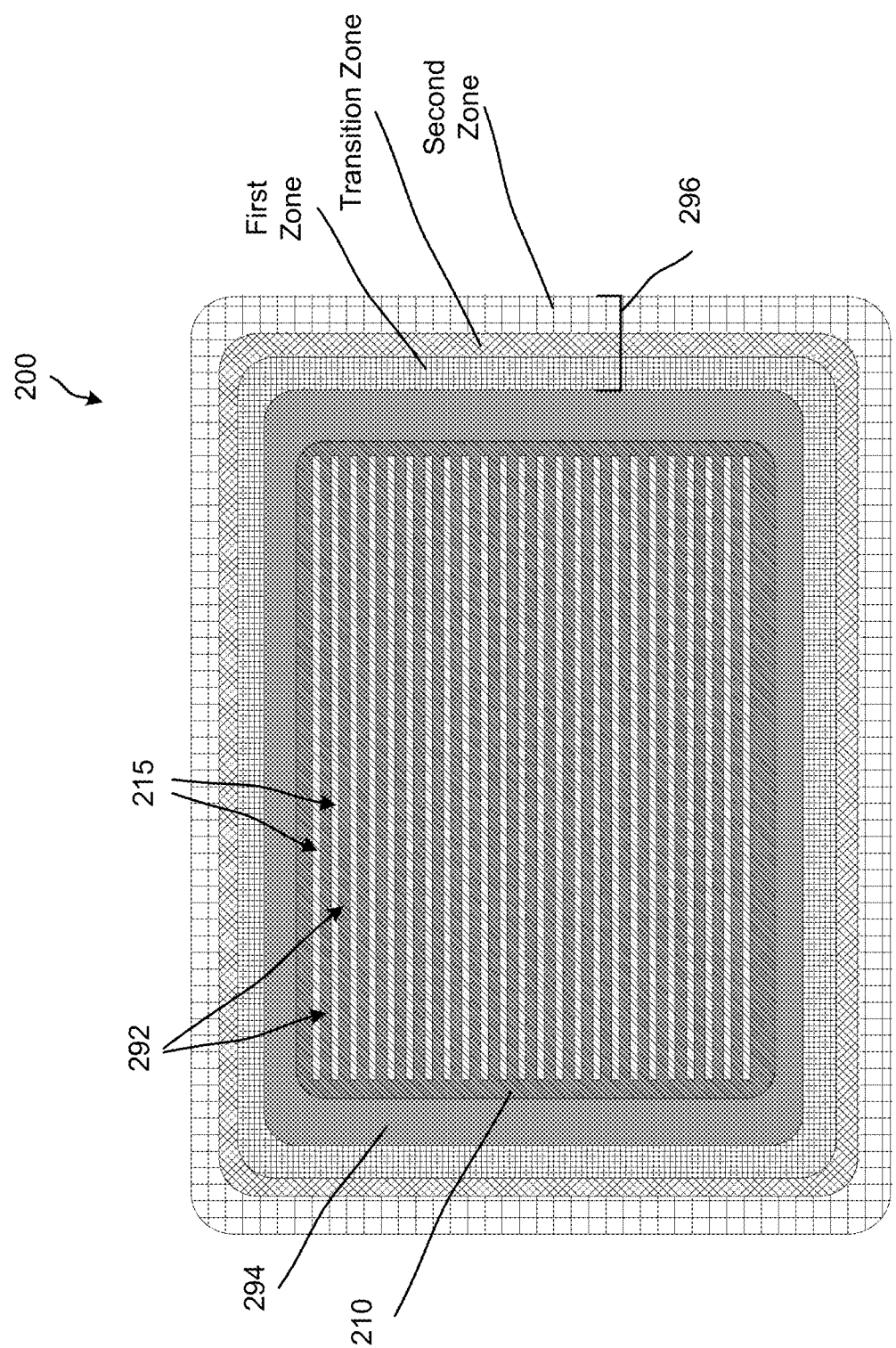
FIG. 2 is a top level diagram of an example implementation of a SiC device.

FIG. 2 is a top level diagram of an example implementation of a SiC device 200 (e.g., a SiC Schottky-barrier power rectifier) in accordance with the embodiments described herein. The SiC device 200 can be an implementation of the SiC device 100 shown in FIG. 1.

As shown in FIG. 2, the SiC device 200 has a first zone, a transition region, and a second zone of a termination region 296. The termination region 296 disposed around a rim 294, shielding bodies 292 and Schottky regions 215. A metal 210 disposed over the shielding bodies 292 and the Schottky regions 215. The metal 210 is disposed over at least a portion of the rim 294.

As shown in FIG. 2, the shielding bodies 292 are parallel trenches that are aligned parallel with the Schottky regions 215. The Schottky regions 215 are parallel regions that are interleaved with the shielding bodies 292.

Referring back to FIG. 1, in some implementations, the SiC device 100 utilizes a Schottky barrier (in the Schottky regions 115) between the metal 100 and the drift region 130. For a Schottky diode (e.g., Schottky regions 115) with an n-type semiconductor layer, for example, the metal layer (e.g., metal 110) acts as the anode, and the n-type semiconductor layer (e.g., drift region 130) acts as the cathode. The SiC device 100 can be a Schottky-barrier diode (SBD) rectifier. The SBD rectifier as a circuit element, in some implementations, can be similar to a PN-diode rectifier, and can have certain advantages and drawbacks as compared to a PN-diode rectifier. The forward voltage drop of a Schottky barrier can be lower than that of a PN diode. The switching losses of an SBD rectifier can be typically lower than those of a PN diode, because of a lack of minority carrier injection. However, the majority carriers will also increase the on-state resistance of the SBD rectifier's designed for higher voltages due to resistance of the drift region, which is the low-doped n-type semiconductor layer that holds the voltage under reverse bias.

Higher blocking voltages of an SBD rectifier can require use of progressively thicker and more resistive drift regions. SBD rectifiers in hexagonal silicon carbide (SiC), for example, take advantage of the high breakdown field of this material, which is approximately 10 times higher than that in silicon. This can, in some implementations, contribute to the reason for SiC SBD rectifiers being a preferred type of rectifier for power conversion applications with high operation voltages. However, SiC SBD rectifiers can suffer from issues with leakage currents as well as from issues with robustness. Unlike some SBD rectifiers, the SiC device 100, in some situations, is as robust as a PN diode under the conditions of surge of forward current, which can be an event in practical applications. Avalanche currents might appear in the rectifier if the voltage exceeds the breakdown voltage. Avalanche currents in power conversion applications can appear if the energy stored in reactive components, such as inductors, is dissipated at the rectifier due to, for example, abrupt impedance changes at a load and/or at a power supply. An example of such abrupt impedance changes are open-circuit or short-circuit conditions at the load. Resulting avalanche currents of a rectifier might be a high value, which is comparable to the nominal rated current. A parallel-plane SBD rectifier in the SiC device 100 may be avalanche robust, and high avalanche current might destroy other such rectifiers.

In some implementations, a technique used for improvement of SBD rectifier leakage currents and/or of SBD rectifier robustness is to use, for example, a design with an array of PN diodes that are distributed over the area of a SBD rectifier. Such a design can be referred to as a merged PN Schottky (MPS) or as a junction blocked Schottky (JBS). The PN diodes of the array can provide injection of minority carriers under the conditions of high forward bias, which can decrease the on-state voltages even at relatively high temperatures. The PN diodes of the array can also decrease the leakage currents and improve the blocking voltage. However, the JBS design may not be entirely free from performance and robustness issues. Excessive currents might occur in the termination region under avalanche conditions, which can result in early destruction. Repeated avalanche and/or surge conditions might result in a drift of important parameters such as the breakdown voltage or the on-state voltage.

The power SBD rectifiers described herein (e.g., SiC device 100) can have an n-type substrate (e.g., substrate 140), a lightly doped drift region (e.g., drift region 130), and/or a linear array of closely spaced ion-implanted p-type shielding bodies (e.g., shielding bodies 192) relatively close to the top surface. A continuous (e.g., substantially continuous) p-type anode rim (e.g., rim 194) can be included at the outer periphery of the p-body array. A junction termination (JT) region (e.g., termination region 196) can be included at the outer periphery of the p-type anode rim. The junction termination region can eliminate, for example, early breakdown and/or failure along the device periphery.

In some implementations, the SBD rectifier (e.g., SiC device 100) can include a grid of spaced (e.g., closely spaced) p-bodies (e.g., shielding bodies 192) in order to shield the Schottky interface from excessively high electric field under, for example, reverse-bias conditions. Unlike the SiC device 100, some implementations of parallel-plane SiC SBD devices may not be avalanche rugged. A variety of physical reasons may contribute to this issue including, for example, inherent non-uniformity of avalanche breakdown in parallel-plane SiC SBDs. If a p-body grid is included in a SBD rectifier then the electric field at the Schottky interface can be at least partially shielded. Peak electric field at a PN junction can exceed the electric field at the Schottky interface by, for example, at least a few tens of percent. The mechanism of avalanche breakdown can be related to impact ionization and to avalanche multiplication, which are strong functions of electric field, and can mathematically be represented by power-law functions with an exponent of 5 or stronger. In some implementations, even a 10% decrease of electric field can suppress avalanche multiplication. An SBD rectifier having a p-body shielding can predominantly be avalanching at the p-bodies rather than at the Schottky interface. By contrast to a parallel-plane SBD rectifier, avalanche breakdown of a PN diode in the SiC device 100 can be avalanche-rugged, which is important from the standpoint of device reliability.

Figure 3:
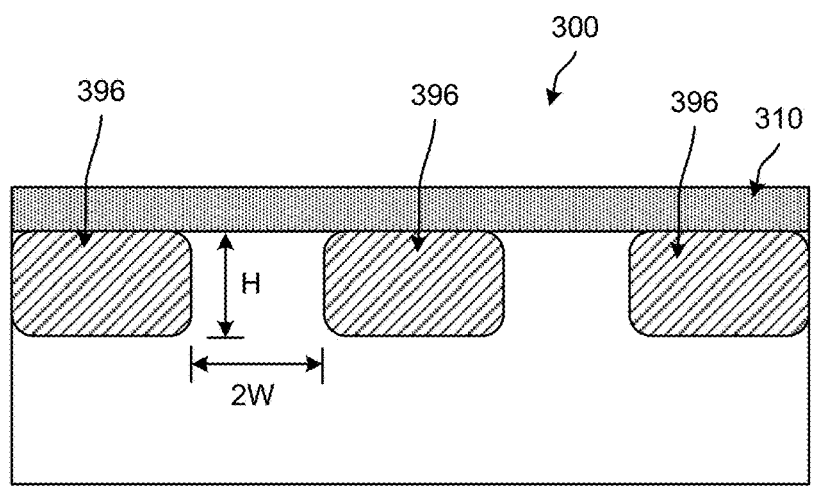
FIG. 3 is a diagram that illustrates a portion of a SiC device with electrostatic shielding by spaced shielding bodies.

FIG. 3 is a diagram that illustrates a portion of a SiC device 300 (e.g., a Schottky-barrier rectifier) with electrostatic shielding by spaced (e.g., closely spaced) shielding bodies 396 (e.g., p-bodies). As illustrated in FIG. 3, the shielding bodies 396 have a depth H (also can be referred to as a height) and are spaced by a width of 2 W. In some implementations, the spacing and height aspect ratios can be different than shown in FIG. 3. The widths of one or more of the shielding bodies 396 can be greater than or less than 2 W. In some implementations, the depth H can be greater than, equal to, or less than 2 W.

Figure 4:
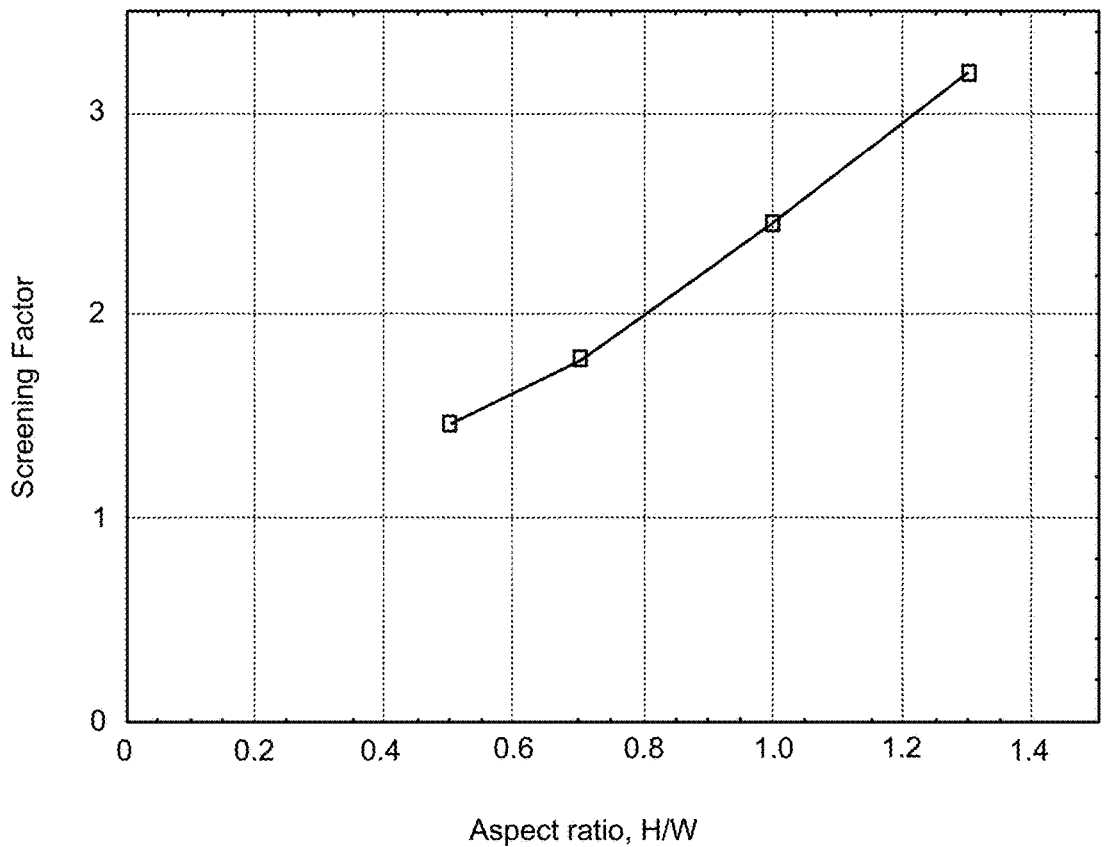
FIG. 4 is a graph that illustrates a dependence of an electric field screening factor on the aspect ratio of a channel such as that shown in FIG. 3.

FIG. 4 is a graph that illustrates a dependence of an electric field screening factor on the aspect ratio of a channel (H/W) such as that shown in FIG. 3. Results of an example calculation of the shielding action for shielding bodies (e.g., closely spaced p-type depletion stoppers) (such as that shown in FIG. 3) is shown in FIG. 4 as a function of the shielding body (e.g., p-body) spacing (2 W) and depth (H). The shielding function plotted in FIG. 4 is defined as the ratio of maximum electric field at the p-body electric field at the metal interface. Both values are calculated for the centers of the respective regions. FIG. 4 illustrates the importance of having sufficiently close spacing to the p-body grid, because a relatively small value of H/W, below approximately 0.2, can result in insufficient electric shielding of Schottky regions (e.g., Schottky metal).

In some implementations, electric shielding of the Schottky regions may have another advantage, as it can decrease the leakage current under relatively high reverse bias. In some implementations, the leakage currents can be related to tunneling, therefore the leakage current of a Schottky barrier can be a function (e.g., strong function) of electric field. In some implementations, a SBD rectifier with higher H/W ratio can have a lower value of leakage current.

In some implementations, such an electric shielding can decrease the leakage currents of the Schottky barrier, because the leakage of Schottky barriers at high reverse bias can be governed by a tunnel mechanism. In some implementations, the tunnel current can have a sharp (e.g., very sharp) dependence on electric field, therefore even a marginal decrease of electric field by around 20% or higher will decrease the leakage by more than an order of magnitude. In some implementations, the marginal decrease can be greater or less than 20%.

Figure 5:
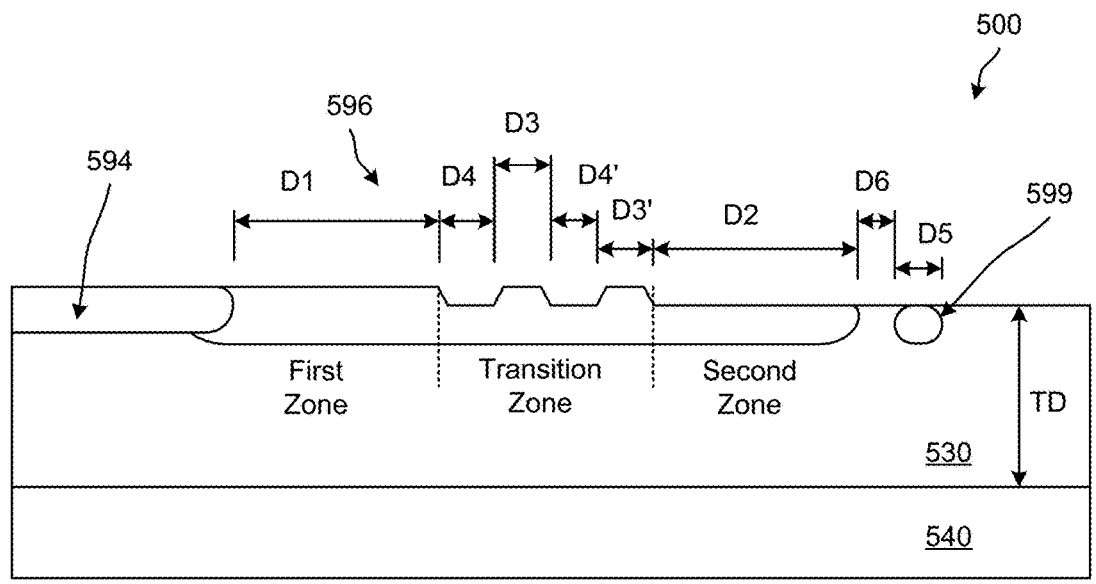
FIG. 5 is a diagram that illustrates a configuration of a junction termination (JT) region.

FIG. 5 is a diagram that illustrates a configuration of a junction termination (JT) region 596 (e.g., termination region 196 shown in FIG. 1) of a SiC device 500 (which can be a implementation of the SiC device 100). In some implementations, the JT region 596 can be formed by implanting a controlled acceptor dose that exceeds the characteristic avalanche dose, Qa=epsilon*Ea/q, where Ea is the critical field of SiC for avalanche breakdown, epsilon the dielectric constant of SiC and q the unit charge. In some implementations, the dose of implanted acceptors can be between approximately Qa and 2.5 Qa. In some implementations, the dose can be less than Qa or greater than 2.5 Qa. In some implementations, acceptor dopant in the JT region 596 can be implanted Al, Ga or B, or alternately the combinations of two or more acceptor types can be co-implanted. The JT region 596 is in contact with a rim 594.

In some implementations, implanted acceptors are thermally activated at a temperature between approximately 1500° C. and 1700° C. In some implementations, the dose of implanted acceptors may depend on thermal budget and on ramp-up time of the annealing system, as well as on the temperature at which the implantation is performed.

In some implementations, certain ring-shaped portions can be removed (e.g., etched) at the outer periphery in the JT region 596 so as to decrease the total amount of remained acceptors by approximately between 10% and 35%. In some implementations, the total amount of remained acceptors can be less than 10% or greater than 35%. In some implementations, for example, if Al or Ga are used as dopants then approximate recess (e.g., etch) depth can be determined numerically from theoretical implantation depth profiles. In some implementations, such profiles can be calculated using a simulation. In some implementations, if boron is used as acceptor, dopant redistribution can be taken into account using actual Secondary-Ion-Mass Spectroscopy (SIMS) profiles that are measured in the SiC wafer after the activation anneal. In some implementations, actual SIMS profiles can be used in the case for boron implantation because redistribution profiles of boron may not be accurately simulated. In some implementations, electrically active (though not necessarily ionized) acceptor dose can be lower than the implanted acceptor dose.

In some implementations, the first zone (e.g., inner ring) of the JT region 596 may not be subject to etch and retain its full activated acceptor dose Q1). In some implementations, the JT region 596 can have a width D1 which is greater than a drift region 530 (e.g., epitaxial layer) thickness $T_D$, D1>$T_D$. In some implementations, the second zone (e.g., outer ring) can have partially removed acceptor charge (Q2) extending to the outer periphery of the JT region 596 and wider than at least the thickness $T_D$ of the drift region 530, D2>$T_D$. In some implementations, the second zone (e.g., outer ring) can have the acceptor charge partially removed (e.g., removed by etching).

In some implementations, a transition zone (e.g., transition belt or band) between first and second zones (e.g., inner and outer zones) (high-Qa and low-Qa rings) consists of an even amount of rings with acceptor charge alternating between Q1 and Q2. In some implementations, mean acceptor charge value for the transition zone can be therefore between Q1 and Q2. In some implementations, presence of transition zone with an intermediate charge value can be helpful from the viewpoint of minimizing (or reducing) electric field concentration. In some implementations, the width of each ring (D3, D4, D3', D4') in the charge transition zone may not exceed approximately one third of the thickness $T_D$ of the drift region 530. In some implementations, the ring size can be less than or equal to one third of the thickness $T_D$ of the drift region 530. In some implementations, the charge transition belt may be efficient for suppression of edge breakdown in an SBD even if it contains a single pair of Q2 and Q1 rings.

As shown in FIG. 5, a substrate 540 is disposed below the drift region 530. The thickness of the drift region 530 is from the substrate 540 to a top of the semiconductor region, which corresponds with a top (e.g., top surface) of the second zone and a floating ring 599.

As shown in FIG. 5, the SiC device 500 includes the floating ring 599 having a thickness D5. The floating ring 599 is separated from the implant associated with the JT region 596 by a distance D6.

In some implementations, the distances D3 through D6 can be made as small as possible. In some implementations, minimum feature size can be limited by a variety of factors. In some implementations, several recessed areas and mesa combinations (D3/D4, D3'/D4') can be included in the JT region 596. In some implementations, the distances (e.g., sizes) of the recessed areas and mesa combinations (e.g., D3, D4, D3', D4') can be less than one third of the thickness $T_D$ of the drift region 530. In some implementations, the distances of the recessed areas and mesa combinations can be greater than or equal to one third of the thickness $T_D$ of the epitaxial layer. In some implementations, distance D5 and D6 can be less than one third of the thickness $T_D$. In some implementations, distance D5 and D6 can be greater than or equal to one third of the thickness $T_D$.

In some implementations, no (or little) breakdown occurs at the outer edge of the JT region 596 or at the steps (e.g., etched steps), and avalanche breakdown occurs via the bulk of the SiC device 500. In some implementations, this is beneficial from the viewpoint of avoiding formation of high-density current filaments, which may destroy the SiC device 500 at the high-level avalanche current that is compared to the forward rated current.

Figure 6:
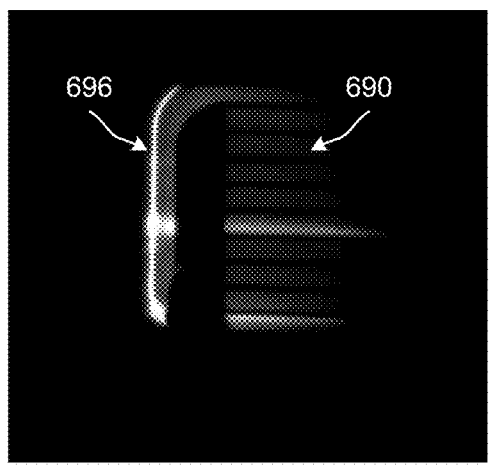
FIG. 6 is an emission image that illustrates breakdown at the outer edge of the JT region.

In some implementations, the function of the JT region 596 can be evaluated using a PN diode, which can have some similarities to SiC device 500 (e.g., SBD rectifier). In some implementations, emission images of such a PN diode under avalanche breakdown conditions are shown in FIG. 6. Specifically, FIG. 6 is an emission image that illustrates no (or little) breakdown at the outer edge of the JT region 696. The streaky pattern indicates proximity of the voltage to the breakdown voltage in the bulk 690. The image in FIG. 6 indicates onset of emission due to avalanche breakdown in the bulk 690.

In some implementations, the emission due to avalanche breakdown can form a relatively streaky pattern along the direction of off-orientation of the hexagonal substrate from the hexagonal axis. In some implementations, that can indicate proximity of achieved breakdown voltage to the bulk 690 breakdown voltage (the theoretical breakdown voltage) within less than 20 Volts. In some implementations, no (or little) emission from the step (e.g., etched step) occurs in the JT region 696. In some implementations, after dicing and packaging, the SBD rectifiers from this wafer can sustain a high value of avalanche current without destruction, as will be explained in a further embodiment.

In some implementations, by contrast, neighbor test diodes that are lacking a step-relaxation mesa do not show acceptable behavior, both SBDs and PN diodes. In some implementations, the breakdown voltage of such diodes may be 100 V to 300 V lower than that for a diode having the step relaxation region. In some implementations, the breakdown of test diodes lacking a step relaxation mesa may also be quite unstable, and irreversible diode degradation may be observed for such diodes at very low value of avalanche current. In some implementations, after degradation the blocking voltage can drop to a relatively low value between approximately 50 V and 250 V. In some implementations, the degradation of blocking voltage can be lower than 50 V or greater than 250 V.

In some implementations, the electrically active dose of non-compensated acceptors in the outer JT region 696 can be precisely controlled. In some implementations, this control may make practical problems, because the extent of acceptor dopant activation in the course of the activation anneal may vary. In some implementations, acceptor compensation by the surface states may also vary depending on specific nature of the surface states. In some implementations, the amount acceptor compensation may vary in the course of device process after deposition or removal of dielectric coatings and as a result of plasma ion damage. In some implementations, the outer p-type ring of the JT region 696 can be fully depleted at a voltage below the avalanche breakdown voltage. In some implementations, the depletion voltage can be at least 15% lower than the breakdown voltage. In some implementations, the depletion voltage can be greater than 15% of the breakdown voltage or less than 15% breakdown voltage.

In some implementations, theoretical calculation of the breakdown voltage in the termination region can be difficult to calculate. First the acceptor charge in the termination region may not be accurately simulated using known technology CAD (TCAD) models. Second, simulation of edge breakdown can require appropriate anisotropic models, because breakdown in SiC occurs easier for the direction along the hexagonal plane than in the direction along the C-axis. However, with anisotropic models, the accuracy of breakdown voltage prediction can be worse than if the anisotropy effect is ignored altogether. This deficiency of TCAD modeling can be an issue as there are independent evidences for practical significance of anisotropy effects in the edge breakdown in SiC devices. Accordingly, design of a JT region 696 for an avalanche robust SBD should take into account experimental data that could be collected for the chosen device design.

In some implementations, depletion of the outer zone of the JT region 696 may be established using multiple techniques, for example, by performing capacitance voltage measurements at relatively high voltages. In some implementations, another relatively efficient way of controlling depletion of the outer zone of the JT region 696 is emission imaging. In some implementations, the outer zone of the JT region 696 according to this disclosure will go in avalanche if this outer zone is non-depleted at a voltage below the avalanche breakdown point. In some implementations, the emission of the outer zone can be observed during a prober test, either with naked eye or using an imaging camera.

Figure 7A:
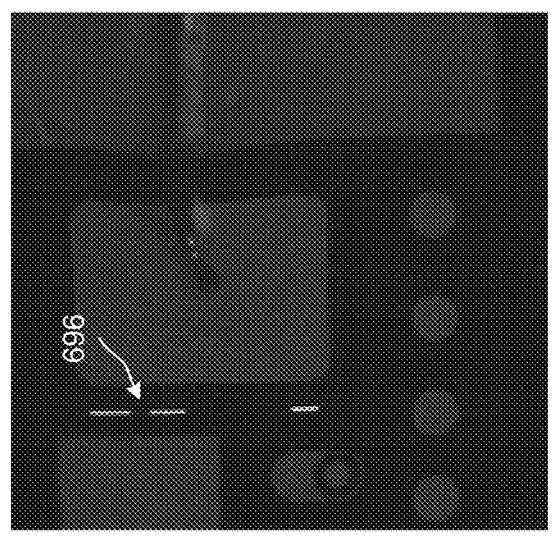
FIG. 7A illustrates emission due to breakdown at an outer edge of a JT region.

FIG. 7A illustrates emission due to breakdown at an outer zone of a JT region 796. As shown in FIG. 7A, emission is seen as 3 portions of a bright vertical line to the left from the test structure. The JT region 796 is, in this case, non-depleted at a required voltage. At least some image distortion occurs due to the dielectric liquid, which is used to prevent air-gap sparks.

Figure 7B:
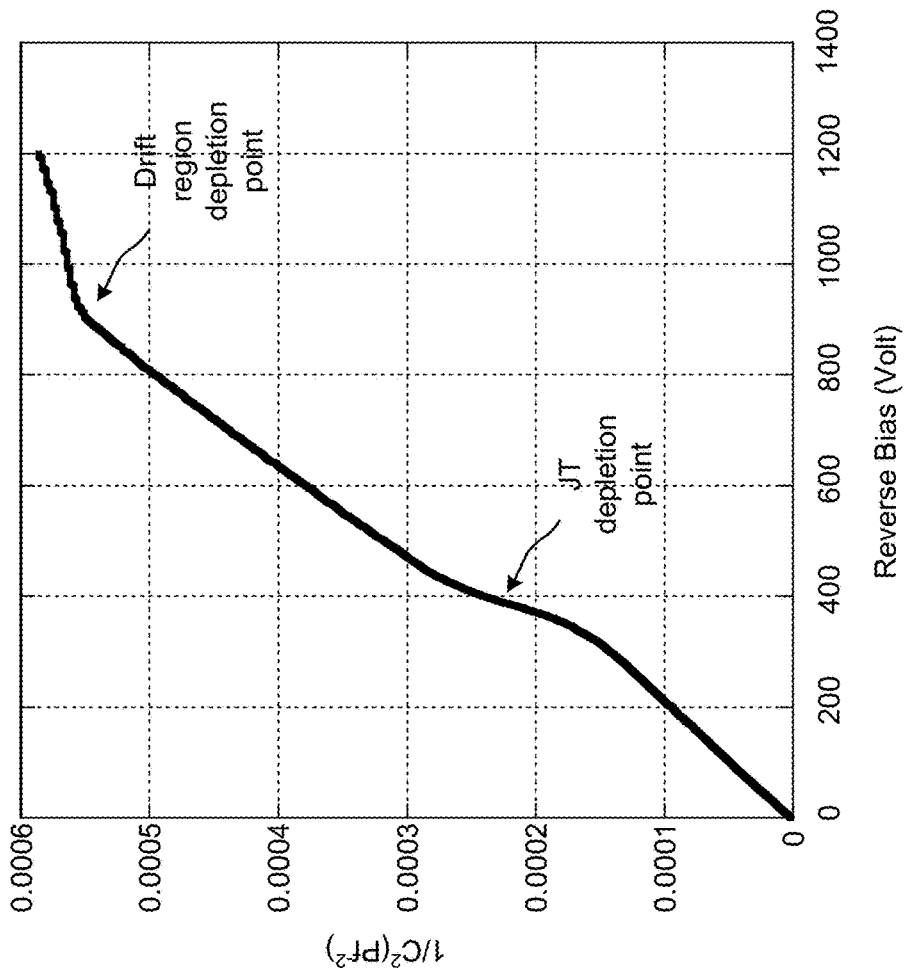
FIG. 7B illustrates a plot of capacitance-voltage characteristics.

FIG. 7B illustrates a plot of capacitance-voltage characteristics of a diode having a JT region. In this figure, capacitance is plotted against reverse bias voltage as $1/C^2$. This particular diode has a drift region with a uniform (e.g., substantially uniform) doping over the drift region thickness and a reach-through voltage of around 900 Volt. For such a diode, the $1/C^2$ is a linear function of the reverse bias until full depletion (e.g., substantially full depletion) of the drift region. At higher voltages, the capacitance is only a relatively weak function of reverse bias. The depletion of the drift region is observed on the plot in FIG. 7B at around 900 Volt, and below this voltage $1/C^2$ increases with the voltage as approximately a linear function. An inflection is illustrated on the plot at around 400 V. This inflection can originate from depletion of the JT region. It is therefore possible to establish the depletion voltage of a junction termination extension (JTE), or of a certain JT portion, from the analysis of the capacitance-voltage plot. Electrical activation of acceptors in the ion-implanted JT is usually unknown, as well as is unknown the exact charge densities at the surface of the JT. It is nevertheless possible to combine the manufacture process with the tests in order to obtain desired charge densities in the JT region and achieve rugged avalanche performance for the diode rectifier as a result.

In some implementations, the JT ion implant forms at least one floating p-type ring at the outer periphery of the main JT body that is electrically connected to the anode region. In some implementations, the floating p-type ring is subject to the same partial removal of acceptor charge as the outer portion of the main JT body. In some implementations, the floating ring can have the same surface height and acceptor height as the outer zone of the continuous JT region. In some implementations, the width of the floating JT ring (rings) and its spacing adjacent p-regions of the JT can be less than approximately one third of the drift region thickness. In some implementations, the floating p-ring may not prevent early breakdown if the main p-type body of the JT does not function properly. However, the floating p-rings might improve distribution of the surface potential at the outer periphery of the JT, which may be important for certain modes of operation.

In some implementations, the JT may have 2 or more zones of decreasing p-layer thickness. In some implementations, at least one of the zones can include a ring of thicker p-layer, for which the thickness has the same value as that for the nearest inner zone.

Figure 8A:
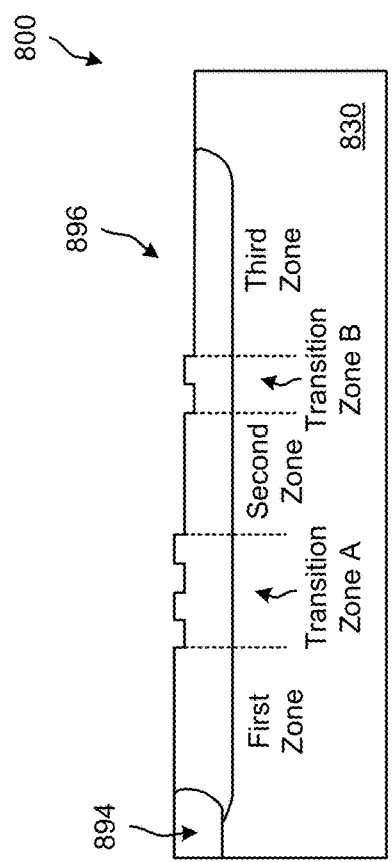
FIGS. 8A and 8B illustrate configurations of 3-zone JT regions with one or more charge transition zones.
Figure 8B:
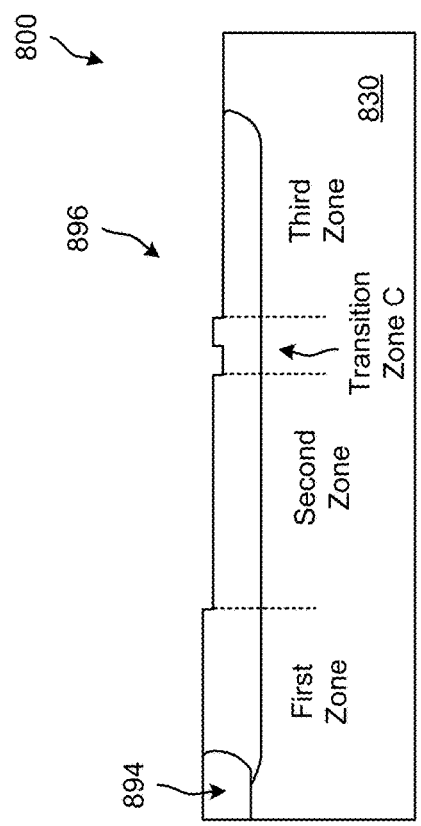

FIGS. 8A and 8B illustrate configurations of 3-zone JT region 896 of a SiC device 800 with two transition zones—transition zone A and transition zone B. The three zones are labeled as a first zone, a second zone, and a third zone. The second zone has a top surface at a depth between a depth of a top surface of the first zone and a depth of a top surface of the third zone. In some implementations, the zones can have depths that are different than shown in FIG. 8A.

In this implementation, the transition zone A has two recesses and two mesas, and the transition zone B has one recess and one mesa. In some implementations, the transition zone A and/or the transition zone B can have a different number of recesses (and/or mesas) than shown. For example, both the transition zone A and transition zone B can have one recess (and/or one mesa), or two recess or more recesses (and/or mesas).

FIG. 8B is a diagram that illustrates the first, second, and third zones with a transition zone C. The first and second zones are delineated by a step (e.g., excluding a transition zone, excluding a mesa and/or recess). In some implementations, the first and second zones can be separated by a transition zone and the second and third zones can be delineated by a step.

In some implementations of FIGS. 8A and 8B, the p-bodies (which are not shown) are implanted in a trench recess. The JT region 896 is in contact with a rim 894. In some implementations, this design can be beneficial because it helps to maintain efficient shielding, while keeping the energy high energy implant (or implants) not excessively high. In some implementations, this is an advantage from the standpoint of cost-efficient manufacturing, while at the same time the total amount of implantation damage is reduced.

In some implementations, the junction depth of the high energy implant can be maintained at a relatively high value of at least 30% of the trench depth in order to provide of the p-body edges so as to avoid electric field crowding. In some implementations, the junction depth can be greater than 30% of the trench depth or less than 30% of the trench depth.

In some implementations, the JT region 896 can have more zones, and/or more or less transition zones. The difference in depth between the zones can be unequal. For example, a difference in depth between the first and second zones can be different than a difference in depth between the second and third zones.

Figure 9:
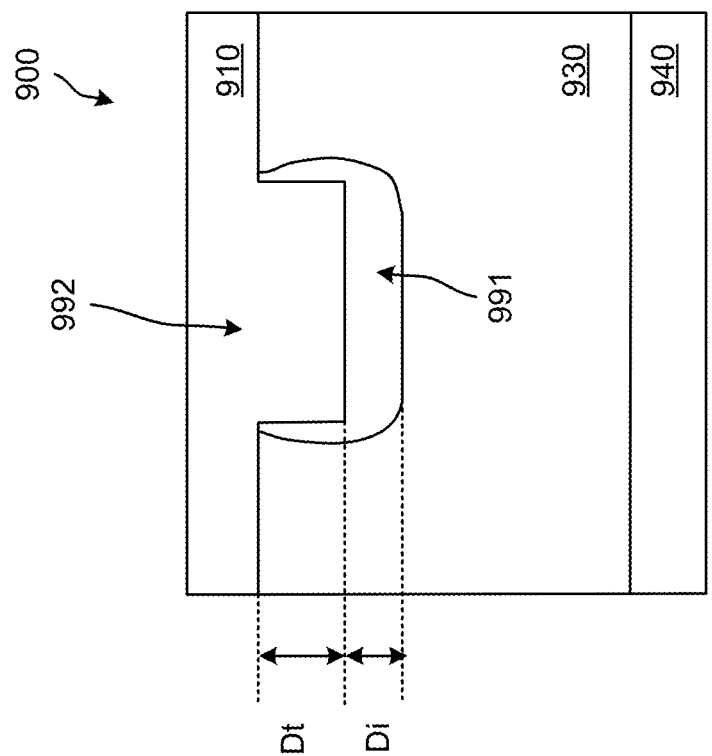
FIG. 9 is a diagram that illustrates a unit cell of a shielding body with vertical sidewalls.

FIG. 9 is a diagram that illustrates a unit cell of a shielding body 992 (e.g., shielding bodies 192 shown in FIG. 1) with vertical sidewalls of a trench within a SiC device 900. A drift region 930 and a substrate 940 are shown.

In some implementations, the trench sidewalls may be inclined (non vertical) at an angle between approximately 45 and 80 degrees to the top diode surface. In some implementations, the angle can be less than 45 degrees or greater than 80 degrees. In some implementations, an implant depth $D_i$ is more than one third of trench depth $D_t$. In some implementations, the ratio of the implant depth $D_i$ to trench depth can be different than one third (e.g., less than or equal to one third).

Figure 10:
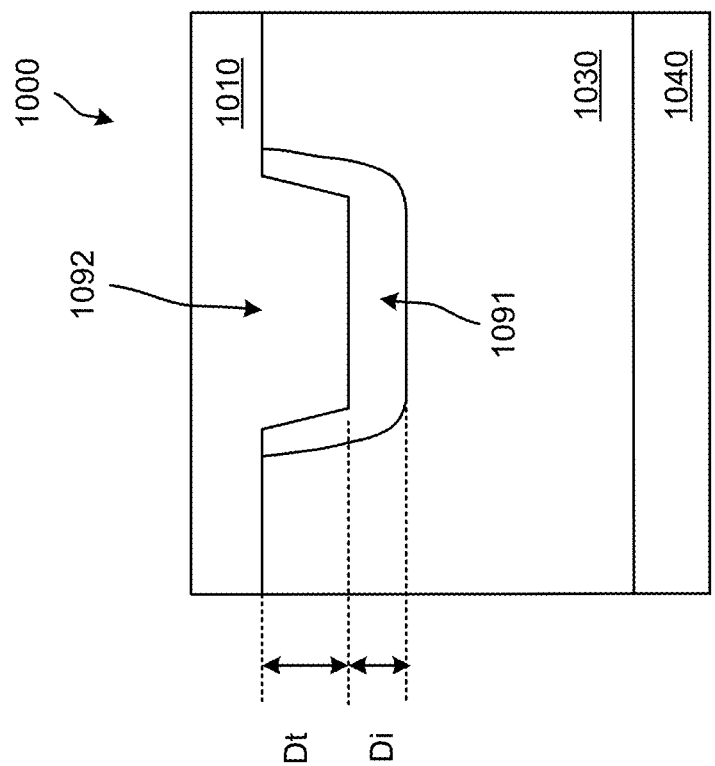
FIG. 10 is a diagram that illustrates a unit cell of a shielding body with inclined sidewalls.

FIG. 10 is a diagram that illustrates a unit cell of a shielding body 1092 (e.g., shielding bodies 192 shown in FIG. 1) with inclined sidewalls of a trench within a SiC device 1000. A drift region 1030, a substrate 1040, and a shielding body doped region 1091 are shown.

In some implementations, the trench sidewalls can be vertical, and the implantation includes inclined implant into the sidewall having an angle to the substrate surface between approximately 30 degrees and 80 degrees. In some implementations, the angle can be less than 30 degrees or greater than 80 degrees. In some implementations, inclined implants can be combined with a normal implant (90 degrees to the surface) for more control of desired dopant profile at the trench. In some implementations, an implant depth $D_i$ is more than one third of trench depth $D_t$. In some implementations, the ratio of the implant depth $D_i$ to trench depth can be different than one third (e.g., less than or equal to one third).

FIGS. 11A and 11B are diagrams that illustrate a process of producing a unit cell of a shielding body 1192 (e.g., shielding bodies 192 shown in FIG. 1) with the vertical sidewalls doped by an inclined implant within a SiC device 1100. A drift region 1130, a substrate 1140, and a shielding body doped region 1191 are shown. Although not shown, the process illustrated in FIGS. 11A and 11B can be applied to a shielding body having inclined sidewalls. In some implementations, a shielding body with an inclined sidewall can be produced using a single implant process.

FIG. 11A illustrates a first doping process with a first inclined implant to define a first side 1091A of a shielding body doped region 1091 and FIG. 11B illustrates a second doping process with a second inclined implant to define the remainder of the shielding body doped region 1091. The diagrams illustrate the unit cell with a mask 1111 disposed on the drift region 1130 during the implant processes.

In some implementations, a trench SiC device (e.g., SBD) in 4H SiC blocks a high voltage of above 1200 Volt and has the breakdown that is characteristic to the breakdown at the PN junction rather than in the metal-semiconductor interface.

Figure 12A:
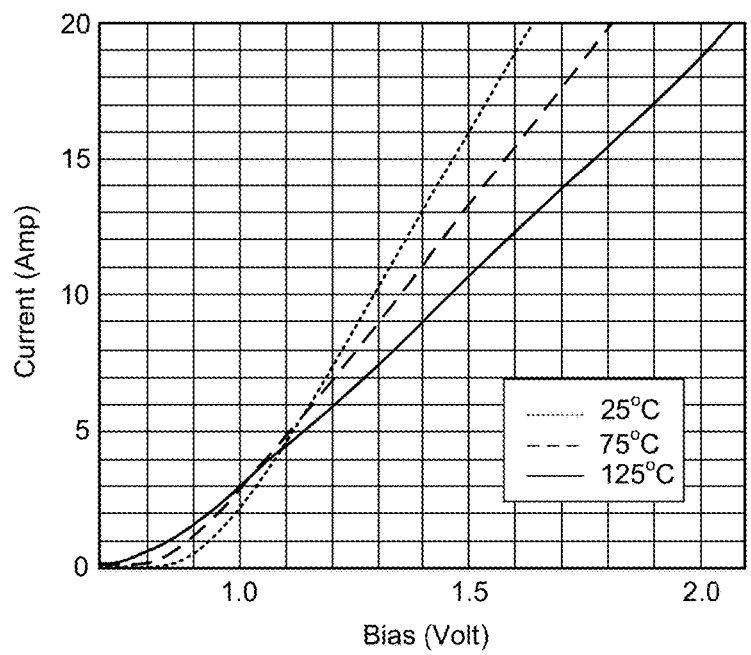
FIGS. 12A and 12B are diagrams that illustrate basic forward and blocking characteristics, respectively, of an SBD rectifier according to embodiment.
Figure 12B:
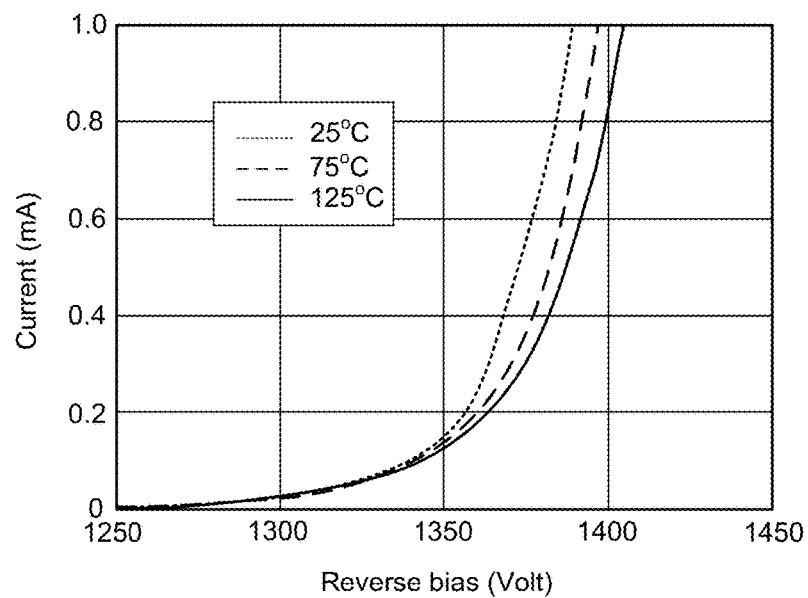

FIGS. 12A and 12B are diagrams that illustrate basic forward and blocking characteristics, respectively, of a SiC device (e.g., an SBD rectifier) according to embodiment. FIGS. 12A and 12B represent the current-voltage characteristic of the SiC device. For example, if the SiC device has a total die area of, for example, approximately 7.1 mm$^2$, and active area of 5.8 mm$^2$, which active area is the area of the chip portion inside a rim (e.g., a p-body rim), the turn-on voltage of about 0.9 V at room temperature corresponds to a Schottky barrier. However, the breakdown voltage of rectifier at high current densities is determined by a PN junction. The leakage at lower current densities can be dominated by the Schottky barrier.

In some implementations, the SiC device has avalanche ruggedness. In some implementations, the avalanche current of the SiC device may exceed the rated on-state current for at least 3 microseconds. In some implementations, the SiC device may exceed the rated on-state current for longer than 3 microseconds. Such avalanche robustness can prevent failure of the power conversion circuit the SiC device is used in and can therefore improve reliability of the circuits in which the SiC device is employed. In some implementations, a set of SiC device diodes can be formed in on off-oriented 4H SiC wafer. In some implementations, the SiC device can have the JT region according to the previous embodiment with a step relaxation zone. In some implementations, the step-relaxation zone can have a single narrow ring-shaped mesa. In some implementations, the wafer can be diced, and one or more SiC devices can be packaged in, for example, a plastic-mold TO-3P package, and the one or more packaged SiC devices can be tested for avalanche ruggedness.

As an example test, PN diodes from the same wafer, which PN diodes had the same size, same JT region as SiC devices can be tested and compared. Each packaged Schottky or PN diode can be configured to sustain at least 1250 V in reverse bias with a leakage current of 0.1 mA or less. No special selection of diodes for the unclamped inductive switch (UIS) test can be performed. Evaluation of avalanche ruggedness can be performed in an automated UIS (unclamped inductive switching) tester. A SiC device can be plugged in the tester circuit in parallel to a high voltage IGBT, which IGBT can be switched (turned off) on an unclamped inductive load. After turn-off of the IGBT energy stored in the inductor can at this point be dissipated in reverse-biased SiC device. For each tested device the IGBT current can be increased at a step of 0.1 A until the destruction of the SiC device. If the value of sustained UIS current exceeded 100 A, the value of current step can be increased from 0.1 A to 1 A. Avalanche currents and energies can be assigned to the highest value of the avalanche current sustained without destruction. Avalanche currents and energies can be calculated as mean values for 5 devices in each test, and the values. Random mean square deviation can also be calculated and provided in the results as shown in Table 1.

TABLE 1

Avalanche ruggedness of a device according to an embodiment.

| device | L (mH) | mean(Iaval) (Amp) | std(Iaval) (Amp) | Ea (mJ) | TAUaval (µs) |
|---|---|---|---|---|---|
| SiC device | 0.02 | 188 | 8 | 380 | 6 |
| SiC PN | 0.02 | 191 | 10 | 383 | 6 |
| SiC device | 0.5 | 42.6 | 1.8 | 480 | 14 |
| SiC PN | 0.5 | 47 | 1.1 | 571 | 14 |
| SiC device | 20 | 7.6 | 0.2 | 618 | 97 |
| SiC PN | 20 | 8.8 | 0.3 | 818 | 111 |

As shown, high numbers of avalanche currents and energies are achieved for SiC devices according to this embodiment. As shown in the table, avalanche energies of the SiC devices are slightly lower than those for the PN diodes. In some implementations, this can be due to the fact that the thermal stability of a Schottky diode is generally a lower value than that for a PN diode.

Also as shown in Table 1, the values of mean-square deviation can also be reasonably low, indicating a well-behaved tight distribution. Three additional sets of UIS tests with the same number of SiC devices can be tested, i.e. 15 units. Those included the packaged parts from other wafers. No SiC device (e.g., SBD rectifier) in those tests failed at a low value of avalanche energy with a high (tens of percent) deviation more from mean value. This is an indication of stable and reproducible behavior of SiC devices according to the embodiment in the UIS test.

Figure 13:
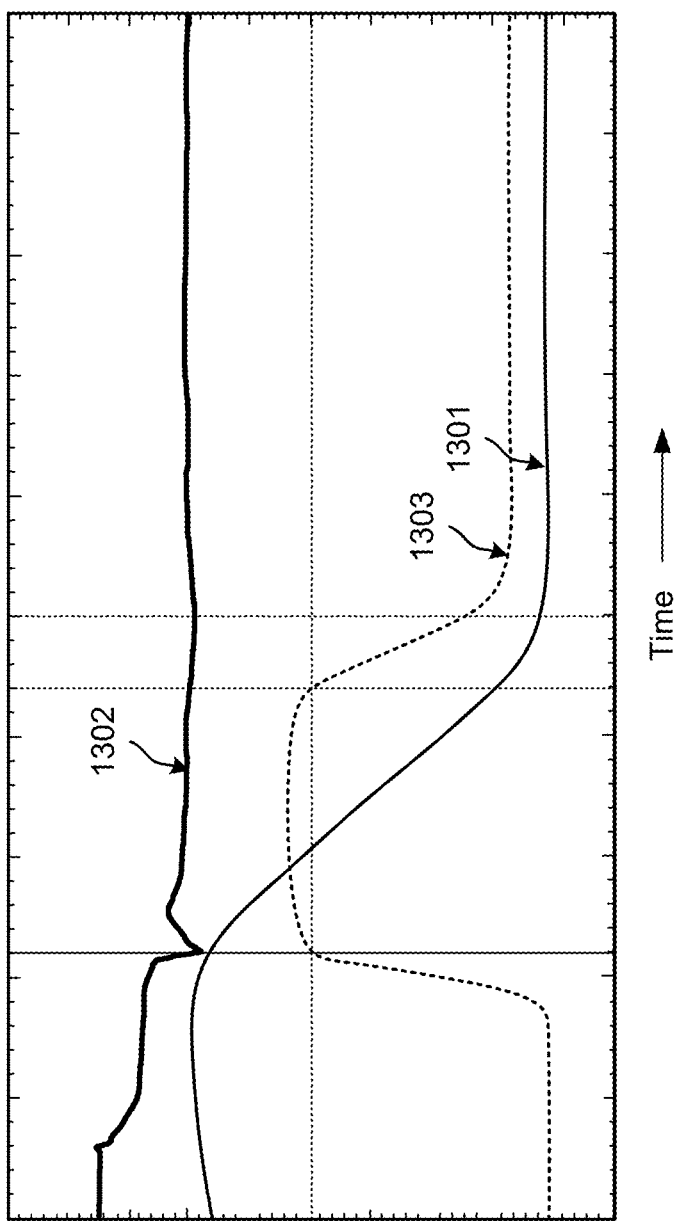
FIG. 13 illustrates a representative set of current and voltage traces obtained with a fast-transient system.

The data set represented in Table 1 was measured using an automated test system. This system can be designed for high throughput, however it not necessarily optimized for tracking fast voltage and current transients, and the numbers for avalanche pulse length may be in error by a few microseconds. A few selected samples were further tested in the system having the capacity for tracking fast transients. In such testing, the avalanche energy was in this case calculated as an integral of the product of voltage multiplied by current over the avalanche pulse duration. A representative set of current and voltage traces obtained with the fast-transient system is shown in FIG. 13 with a load inductance of 0.02 mH. Specifically, FIG. 13 illustrates a current trace 1301 and a voltage trace 1302 for a non-destructive avalanche pulse 1303 in a SiC device (e.g., SBD rectifier).

As shown in FIG. 13, actual avalanche duration time can be a smaller value than that obtained with the automated system—a value of approximately 2.3 microseconds can be obtained. The avalanche energy, in this example, is approximately 0.395 J, which can be a close number to the avalanche energy obtained with the automated test system.

A set of diodes UIS-tested SiC devices (e.g., SBD rectifiers) that reach the destruction point can be extracted from packages and examined for the pattern of damage. All inspected rectifiers can have a damaged location of large area, which indicates distributed pattern avalanche current. All tested diodes can have a location of damaged spot in the central portion of the chip. In some implementations, no damage may be observed in the JT region.

Figure 14:
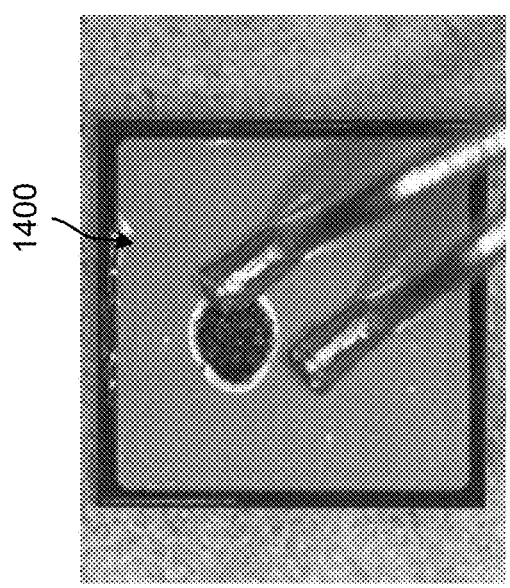
FIG. 14 is a diagram that illustrates a failure mode of a device according to embodiment in unclamped inductive switch (UIS) test.

FIG. 14 is a diagram that illustrates a failure mode of a SiC device 1400 according to embodiment in UIS test. A representative image of the SiC device 1400 (e.g., a SBD rectifier die), which is destroyed in a UIS test is shown in FIG. 14. This particular die was tested with a load of 20 mH. No damage is observed in the termination region. The die size is 2.66 mm×2.66 mm.

In some implementations, the SiC device 1400 has avalanche robustness under repetitive avalanche conditions. In some implementations, the SiC device 1400 retains at least one half of single-pulse avalanche energy for destruction in repetitive avalanche mode after 1000 pulses of avalanche current with substantially uncharged breakdown voltage and forward voltage drop within approximately 1%.

In an example test, repetitive UIS tests can be performed for the SiC devices (e.g., SBD rectifiers) to establish if instability modes apply to the SiC devices. The tests can include applying a sequence of 50K avalanche pulses, measuring the basic DC parameters and repeating the set of avalanche pulses at a higher avalanche current.

Tests can be performed using a load inductor of 0.02 mH in the configuration described above. Pulse repetition frequency can be 200 Hz, and the number of pulses with constant avalanche current can be 100. After each hundred of avalanche pulses the avalanche current can be increased by 0.1 A. Total increase of avalanche current in a single series of pulses can be therefore approximately 10 A. Breakdown voltage and on-state voltage drop can be measured before and after the test and after each series of 10000 avalanche pulses.

The avalanche destruction current for the SiC devices can be between approximately 160 A and 170 A, which is approximately 10-15% lower than the failure current for a single-shot avalanche tests. A decrease of avalanche current due to repetitive test conditions can also be determined for silicon devices, and is explained as a result of thermal effects. The breakdown voltage remained unchanged in the course of repetitive avalanche test. No changes of breakdown voltage observed can exceed 1 Volt, which can be the resolution of the high voltage test system used in the tests. The drift of the breakdown voltage in the course of avalanche tests can occur due to charging of the passivation dielectric in the termination region. Such a process may not apply for the devices according to the embodiment. Forward voltage drop can remain a stable value until the region in close proximity to the destruction point. The plot of forward drop as function of avalanche current is shown, as an example, in FIG. 15.

Figure 15:
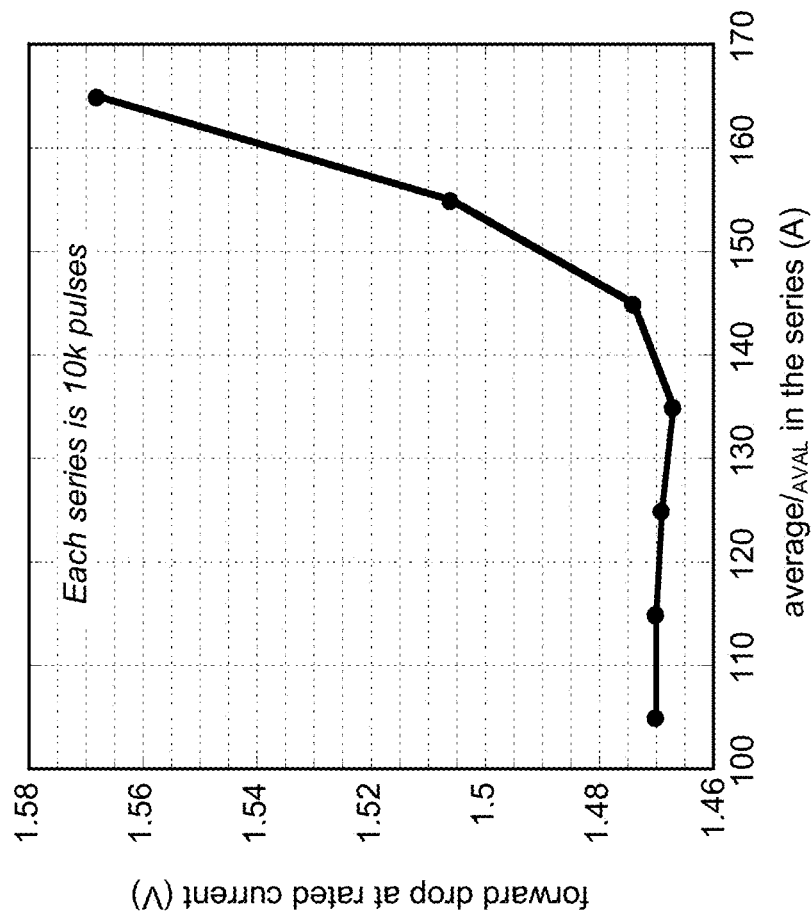
FIG. 15 illustrates a plot of a forward drop as function of avalanche current.

Specifically, FIG. 15 illustrates evolution of a forward voltage drop as function of SiC device (e.g., SBD) avalanche current in repetitive avalanche tests. Measurements were done after sets of 10K avalanche pulses. Avalanche current is assigned to mean current in each series of pulses. In some implementations, the surface of the SiC device may receive local planarization. In some implementations, a safe operating area (SOA) buffer can be included between a substrate and a drift region in order to improve avalanche robustness.

In some implementations, a silicon carbide high power rectifier can include a silicon carbide substrate with an n-type drift layer having a surface with a plurality closely spaced shielding p-bodies, a p-body rim at the surface surrounding the shielding p-bodies, a p-type junction termination region, an Ohmic contact at the substrate bottom and a metal contact overlapping the inner edges of the p-body rim so as to form a Schottky contact to the drift region and a contact to the p-bodies. In some implementations, the rectifier can sustain an avalanche current that is equal to at least a full rated (e.g., substantially a full rated) continuous forward current for at least 3 microseconds.

In some implementations, a high power rectifier can include a silicon carbide substrate with a n-type drift layer having a surface with a plurality closely spaced shielding p-bodies, a p-body rim at the surface surrounding the shielding p-bodies, a p-type junction termination region, where the junction termination can prevent (e.g., fully prevent, substantially prevent) early breakdown and failure along the device periphery, and the Schottky-barrier rectifier can have an avalanche robustness to sustain at least a full rated (e.g., substantially a full rated) forward current for at least 3 microseconds.

In some implementations, a high power Schottky rectifier in SiC can have ruggedness to repetitive avalanche, where the basic rectifier parameters such as the forward voltage drop and the breakdown voltage remain unchanged within approximately 1% after a series of 1000 avalanche current pulses, which pulses have at least one half the destruction energy for the single-shot avalanche event.

Figure 16:
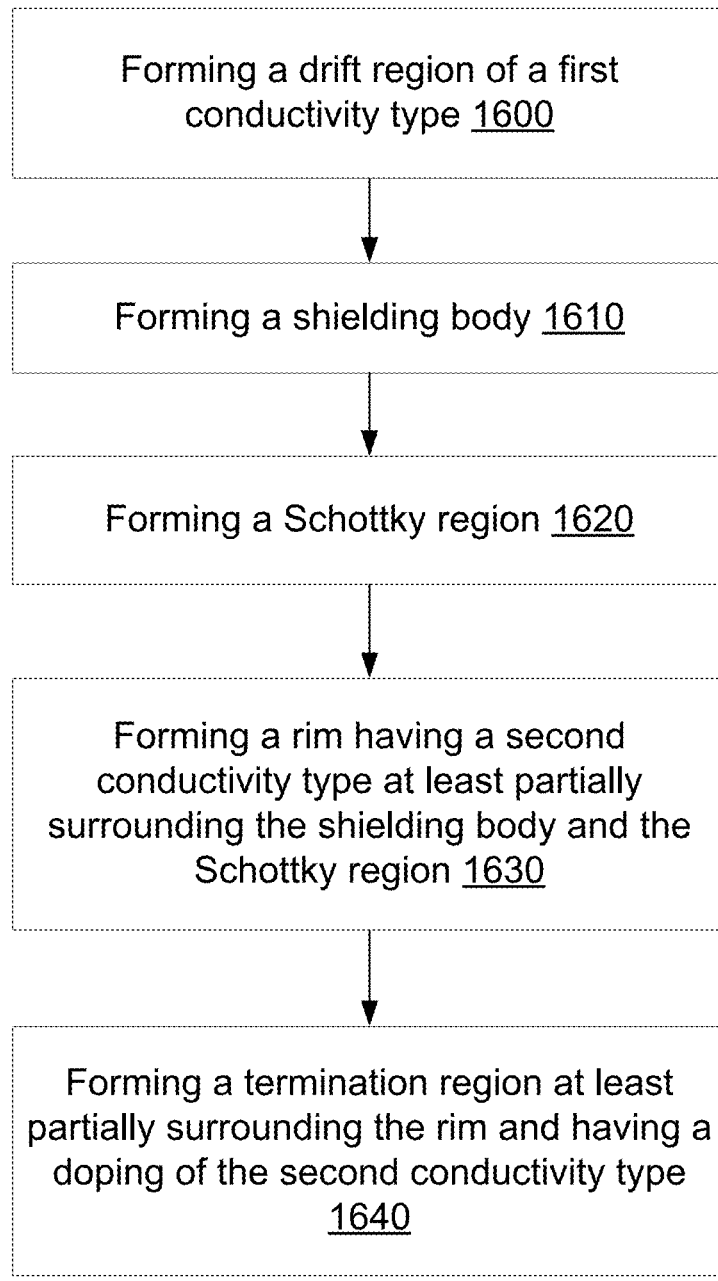
FIG. 16 is a flowchart that illustrates a method for producing a SiC device.

FIG. 16 is a flowchart that illustrates a method for producing a SiC device. The method includes forming a drift region of a first conductivity type (block 1600), forming a shielding body (block 1610), and forming a Schottky region (block 1620). The method also can include forming a rim having a second conductivity type at least partially surrounding the shielding body and the Schottky region (1630) and forming a termination region at least partially surrounding the rim and having a doping of the second conductivity type. The termination region, when formed can have a transition zone disposed between a first zone and a second zone (and/or another zone). The first zone can have a top surface lower in depth than a depth of a top surface of the second zone. The first zone, the second zone, the transition zone, and/or so forth, can be formed by doping the termination region and removing portions (e.g., etching portions) to define the first zone, the second zone, the transition zone, and/or so forth. Accordingly, the transition zone can have, for example, a recess.

It will also be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application-specific integrated circuit).

Implementations may be implemented in a computing system that includes a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

Some implementations may be implemented using various semiconductor processing and/or packaging techniques. Some implementations may be implemented using various types of semiconductor processing techniques associated with semiconductor substrates including, but not limited to, for example, Silicon (Si), Galium Arsenide (GaAs), Galium Nitride (GaN), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A silicon carbide (SiC) device, comprising:
   a drift region of a first conductivity type;
   a shielding body;
   a Schottky region;
   a rim having a second conductivity type at least partially surrounding the shielding body and the Schottky region; and
   a termination region at least partially surrounding the rim, the termination region having a transition zone disposed between a first zone and a second zone, the second zone having a top surface lower in depth than a depth of a top surface of the first zone, the transition zone having a recess, the first zone, the second zone, and the transition zone each having a doped region of the second conductivity type.

2. The SiC device of claim 1, the shielding body has a shielding body doped region that has a doping concentration the same as the doping concentration of a rim doped region of the rim.

3. The SiC device of claim 1, wherein the first zone has a depth equal to a depth of the doped region of the second zone.

4. The SiC device of claim 1, wherein the doped region of the transition zone has a depth that is the same as a depth of the doped region of the first zone and as a depth of the doped region of the second zone.

5. The SiC device of claim 1, wherein the transition zone has an edge defined by a step.

6. The SiC device of claim 1, wherein the shielding body is defined by a trench and a shielding body doped region, the shielding body doped region has a thickness at least one third of a depth of the trench.

7. A silicon carbide (SiC) device, comprising:
   a drift region of a first conductivity type;
   an array of a plurality of shielding bodies interleaved with a plurality of Schottky regions;
   a rim having a second conductivity type at least partially surrounding the array; and
   a termination region at least partially surrounding the rim, the termination region having a first zone having a doped region with a first thickness, the termination region having a second zone having a doped region with a second thickness different from the first thickness, the first zone has a top surface higher than a top surface of the second zone.

8. The SiC device of claim 7, the plurality of shielding bodies each has a shielding body doped region that has a doping concentration the same as the doping concentration of a rim doped region of the rim.

9. The SiC device of claim 7, wherein the termination region is doped with the second conductivity type, the doped region of the second zone has a depth equal to a depth of the doped region of the first zone.

10. The SiC device of claim 7, wherein the termination region has a transition zone disposed between the second zone and the first zone,
    the first zone is disposed between the rim and the transition zone,
    the first zone has a top surface that is substantially flat,
    the second zone has a top surface that is substantially flat and lower in depth than a depth of the top surface of the first zone, and
    the transition zone has a recess.

11. The SiC device of claim 7, wherein the termination region has a transition zone disposed between the first zone and the second zone,
    the doped region of the first zone on a first side of the transition zone has a relatively high charge, and the doped region of the second zone on a second side of the transition zone has a relatively low charge.

12. The SiC device of claim 7, wherein at least one of the plurality of shielding bodies is defined by a trench and a shielding body doped region, the shielding body doped region has a thickness at least one third of a depth of the trench.

13. The SiC device of claim 7, wherein at least one of the plurality of Schottky regions is defined by a metal disposed over a mesa between a pair of the plurality of shielding bodies, the metal is disposed over the pair of the plurality of shielding bodies.

14. A silicon carbide (SiC) device comprising:
    a drift region of a first conductivity type;
    an array of a plurality of shielding bodies interleaved with a plurality of Schottky regions;
    a rim having a second conductivity type at least partially surrounding the array; and
    a termination region at least partially surrounding the rim, the termination region having a first zone having a doped region with a first thickness, the termination region having a second zone having a doped region with a second thickness different from the first thickness,
    the termination region having a transition zone disposed between the first zone and the second zone, the transition zone having a doped region that has a first portion and a second portion, the first portion having a thickness that is different than a thickness of the second portion.

15. The SiC device of claim 14, wherein
    the first zone has a top surface that is substantially flat,
    the second zone has a top surface that is substantially flat and lower in depth than a depth of the top surface of the first zone.

16. The SiC device of claim 14, wherein the transition zone has a doped region having a depth that is the same as a depth of the doped region of the first zone and as a depth of the doped region of the second zone.

17. A method of producing a silicon carbide (SiC) device, comprising:
    forming a drift region of a first conductivity type;
    forming a shielding body;
    forming a Schottky region;
    forming a rim having a second conductivity type at least partially surrounding the shielding body and the Schottky region; and
    forming a termination region at least partially surrounding the rim,
    the termination region having a transition zone disposed between a first zone and a second zone, the second zone having a top surface lower in depth than a depth of a top surface of the first zone, the transition zone having a recess, the first zone, the second zone, and the transition zone each having a doped region of the second conductivity type.

18. The SiC device of claim 17, wherein the shielding body has a shielding body doped region that has a doping concentration the same as the doping concentration of a rim doped region of the rim.

19. The SiC device of claim 17, wherein the doped region of the first zone has a depth equal to depth of the doped region of the second zone.

* * * * *